United States Patent
Hamel et al.

(10) Patent No.: US 9,159,616 B2
(45) Date of Patent: Oct. 13, 2015

(54) SILICON CARRIER SPACE TRANSFORMER AND TEMPORARY CHIP ATTACH BURN-IN VEHICLE FOR HIGH DENSITY CONNECTIONS

(75) Inventors: Harvey Hamel, Cedarville, NY (US); John Ulrich Knickerbocker, Monroe, NY (US); Samuel McKnight, New Paltz, NY (US); Chirag S. Patel, Peekskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 569 days.

(21) Appl. No.: 13/569,915

(22) Filed: Aug. 8, 2012

(65) Prior Publication Data

US 2014/0235027 A1    Aug. 21, 2014

Related U.S. Application Data

(62) Division of application No. 12/024,655, filed on Feb. 1, 2008, now Pat. No. 8,310,259.

(51) Int. Cl.
*H01L 21/44* (2006.01)
*H01L 21/768* (2006.01)
*G01R 31/28* (2006.01)
*H01L 49/02* (2006.01)

(52) U.S. Cl.
CPC ...... *H01L 21/76885* (2013.01); *G01R 31/2889* (2013.01); *H01L 28/10* (2013.01); *H01L 28/40* (2013.01); *G01R 31/2893* (2013.01); *G01R 31/2894* (2013.01)

(58) Field of Classification Search
CPC .......... G01R 31/2889; G01R 31/2893; G01R 31/2894; H01L 21/76885; H01L 28/10; H01L 28/40
USPC ................................ 438/14, 15, 18, 108, 381
See application file for complete search history.

(56) References Cited

U.S. PATENT DOCUMENTS 6,799,976 B1 * 10/2004 Mok et al. ................ 439/55
2008/0284037 A1 * 11/2008 Andry et al. ............. 257/774

* cited by examiner

*Primary Examiner* — Dung Le

(74) *Attorney, Agent, or Firm* — F. Chau & Associates, LLC

(57) ABSTRACT

A silicon carrier space transformer assembly includes one or more silicon structures, which provide space transformer scaling to permit interconnection for fine pitch input/output interconnections with a semiconductor die or wafer, and fine pitch test probe tips connected to the one or more silicon structures.

7 Claims, 4 Drawing Sheets

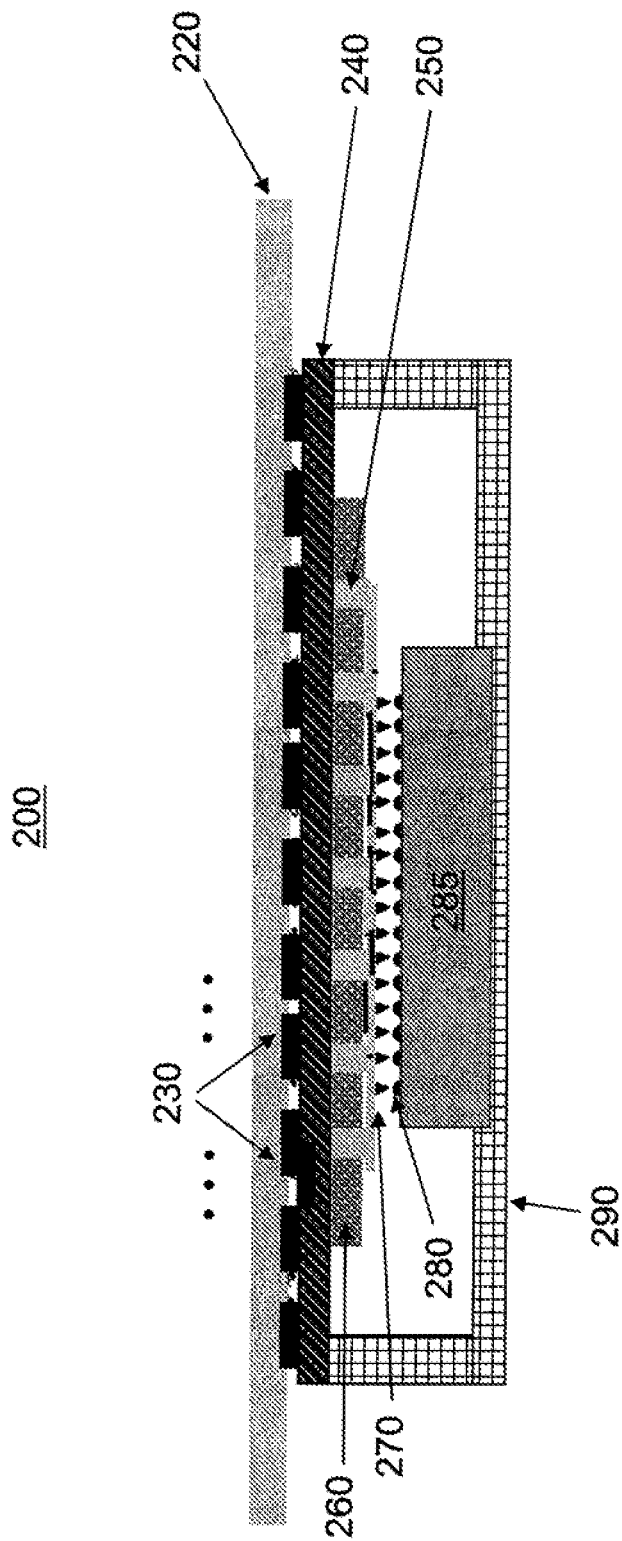

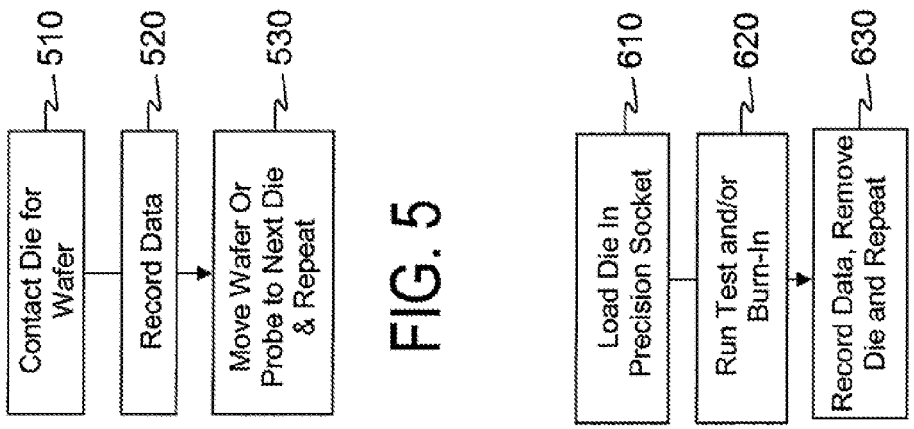
FIG. 5
FIG. 6
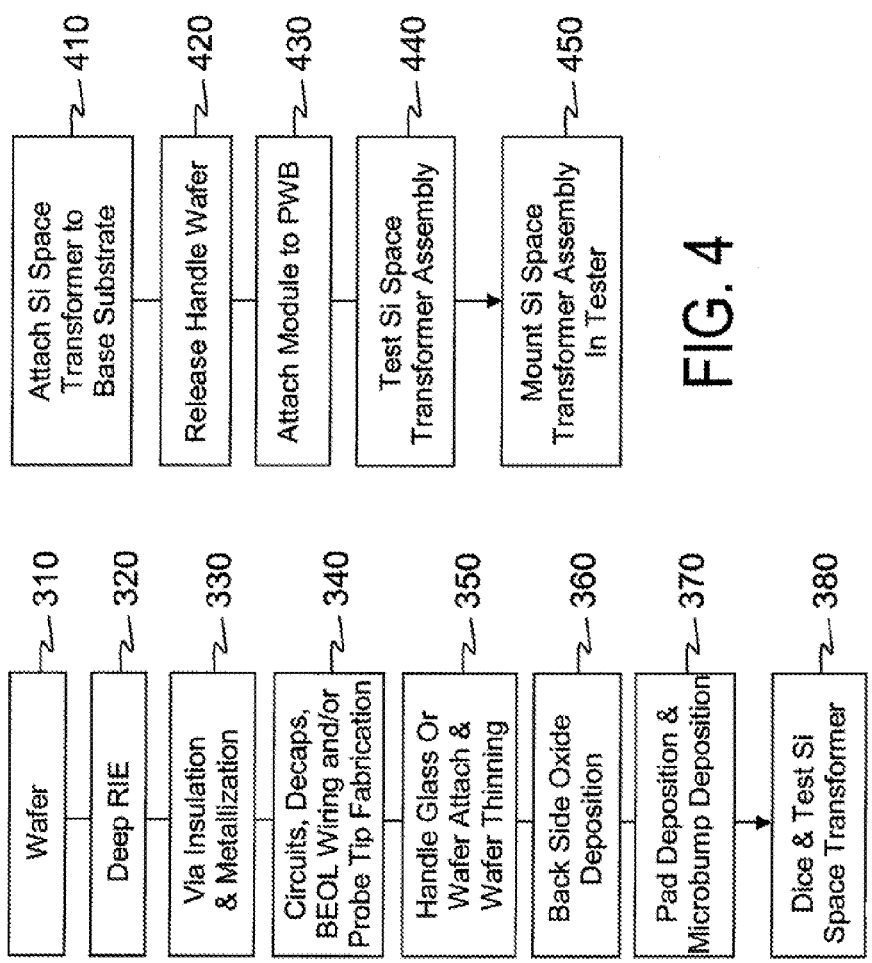
FIG. 4
FIG. 3

SILICON CARRIER SPACE TRANSFORMER AND TEMPORARY CHIP ATTACH BURN-IN VEHICLE FOR HIGH DENSITY CONNECTIONS

CROSS-REFERENCE TO RELATED APPLICATION

This is divisional application of U.S. application Ser. No. 12/024,655, filed Feb. 1, 2008, the disclosure of which is herein incorporated by reference in its entirety.

FEDERALLY SPONSORED RESEARCH AND DEVELOPMENT

This invention was made with Government support under Contract No. NBCHC020056 and MDA972-03-3-0004 awarded by Defense Advanced Research Projects Agency (DARPA). The Government has certain rights in this invention.

BACKGROUND OF THE INVENTION

1. Technical Field

The present disclosure relates to semiconductor microelectronics and, more particularly, to test hardware probes, space transformers and structures, and test methods which enable test and burn-in for semiconductor wafers, die, die stacks or other semiconductor and packaging hardware.

2. Discussion of Related Art

Semiconductor chips and wafers support an increasing number of transistors as each new generation of semiconductor technology leverages the ability to use smaller device feature sizes produced from more advanced lithography. Advances in semiconductor technology have contributed to the reduction in the size and cost of chips and helped to improve cost-effective semiconductor devices. To take advantage of the semiconductor feature size reduction, the number of input/output (I/O) connections that are needed to support power, ground and signal interconnections may increase, which may require an increase in I/O interconnection density for each chip or die.

In the case of memory die, peripheral connections may be made around the perimeter of the die. In the case of processor chips, often area array connections are made across the bottom surface of a die. In addition to the advancing need for increased I/O to test chips and wafers, new applications utilizing through silicon connections for stacked die and wafers are emerging and further driving the need for enhanced I/O interconnection, as well as the need to be able to test these advanced die, wafers, stacked chips or stacked wafers.

Existing solutions for testing die and wafers include using ceramic probes, wirebond probes or thin film probes to test die with perimeter I/O or area I/O. Feature sizes for perimeter I/O are typically used in industry leading wirebond tools that are used to later connect the chips to a package where I/O count at the perimeter of the chip may be up to a few hundred I/O (typically <<1000 I/O) and with a pad to pad I/O pitch on the order of 30 to 50 microns minimum pitch. For area array interconnections, die typically have a minimum of 150 to 200 micron pad-to-pad or bump-to-bump interconnection pitch. Solutions in development may have an area array of 150 micron pad-to-pad or bump-to-bump interconnection pitch with the number of I/O on the order of a few thousand 110 (typically <<5,000 I/O). Thus, depending on chip or wafer test needs, interconnection test probes may have from tens of contacts to a few hundreds of contacts or even to a few thousand connections, which support power and ground but are typically limited to under 512 signal I/O, which may be stated as $10^2$ connections per centimeter squared to $10^3$ connections per centimeter squared.

A thin interface probe has been developed for making interconnection to pads or bumps where a flexible membrane with an array of electrode probe tips is used to contact an array of bumps or pads. Although this technology is utilized for area array contacts and to penetrate a bump or pad for electrical test, since it does not scale to very small scale pitch area pad and bump contacts while maintaining dimensional stability at both time zero for testing and throughout the life of testing, it does not lend itself to the dense arrays of pads and bumps.

One type or category of probe is known as a "Cobra Probe". The Cobra Probe includes a plurality of wires that are mounted in parallel with their ends ending in a plane that is traverse to the axis of wires, such that the wire ends facilitate probing. Each wire is rigid enough to apply pressure, and the mechanical assembly of the wires can provide testing but is limited due to capacitance and inductance as well as center-to-center pitch of probe contacts to test an array or pads and/or bumps.

A probe referred to as a "Buckling Beam Probe" has probes which buckle under an axial load to provide load against pads or bumps. The performance of Buckling Beam Probes is limited due to capacitance, inductance and pitch spacing to pads and/or bumps.

A probe card has an electrically conductive probe assembly array of radiating contact tips. Probe cards have limited probe density.

Contact structures, which can support perimeter pad connections and array connections to pads or bumps at a large spacing while maintaining springable shape, have been developed but have limitations in pitch and electrical parasitics which limit its use.

A need exists for test probes and burn-in probes or sockets that can make contact to fine pitch area array and fine pitch perimeter I/O, die stacks, wafers, die, packages and microelectronic hardware.

BRIEF SUMMARY

According to an exemplary embodiment of the present invention, a silicon carrier space transformer assembly includes one or more silicon structures, which provide space transformer scaling to permit interconnection for fine pitch input/output interconnections with a semiconductor die or wafer, and fine pitch test probe tips connected to the one or more silicon structures.

According to an exemplary embodiment of the present invention, a test system includes a silicon space transformer probe head structure, a memory system for storing a program code for a testing procedure, and a processor in communication with the memory system, wherein the processor executes the program code to implement testing of a device under test using the silicon space transformer probe head structure.

According to an exemplary embodiment of the present invention, a method of fabricating a silicon carrier space transformer includes etching a wafer to forming etched vertical holes in the wafer, forming via insulation and metallization using thermal oxidation, forming back-end-of-line wiring to form X-Y wiring interconnections for space transformation connections, power and ground, forming at least one of surface pads, microbumps or copper interconnections; and forming a number of probe tips on the wafer.

The present invention will become readily apparent to those of ordinary skill in the art when descriptions of exemplary embodiments thereof are read with reference to the accompanying drawings.

BRIEF DESCRIPTION OF THE SEVERAL VIEWS OF THE DRAWINGS

FIG. 2 is a block diagram schematically illustrating a silicon carrier space transformer assembly, according to an exemplary embodiment of the present invention, for example, for use as a socket for die burn-in.

FIG. 3 is a flowchart illustrating a method of fabricating a silicon carrier space transformer assembly, according to an exemplary embodiment of the present invention.

FIG. 4 is a flowchart illustrating a method of assembling a silicon space transformer assembly, according to an exemplary embodiment of the present invention.

FIG. 5 is a flowchart illustrating a method of wafer level test, according to an exemplary embodiment of the present invention.

FIG. 6 is a flowchart illustrating a method for use of a socket for die test and/or for burn-in, according to an exemplary embodiment of the present invention.

DETAILED DESCRIPTION

Figure 1:
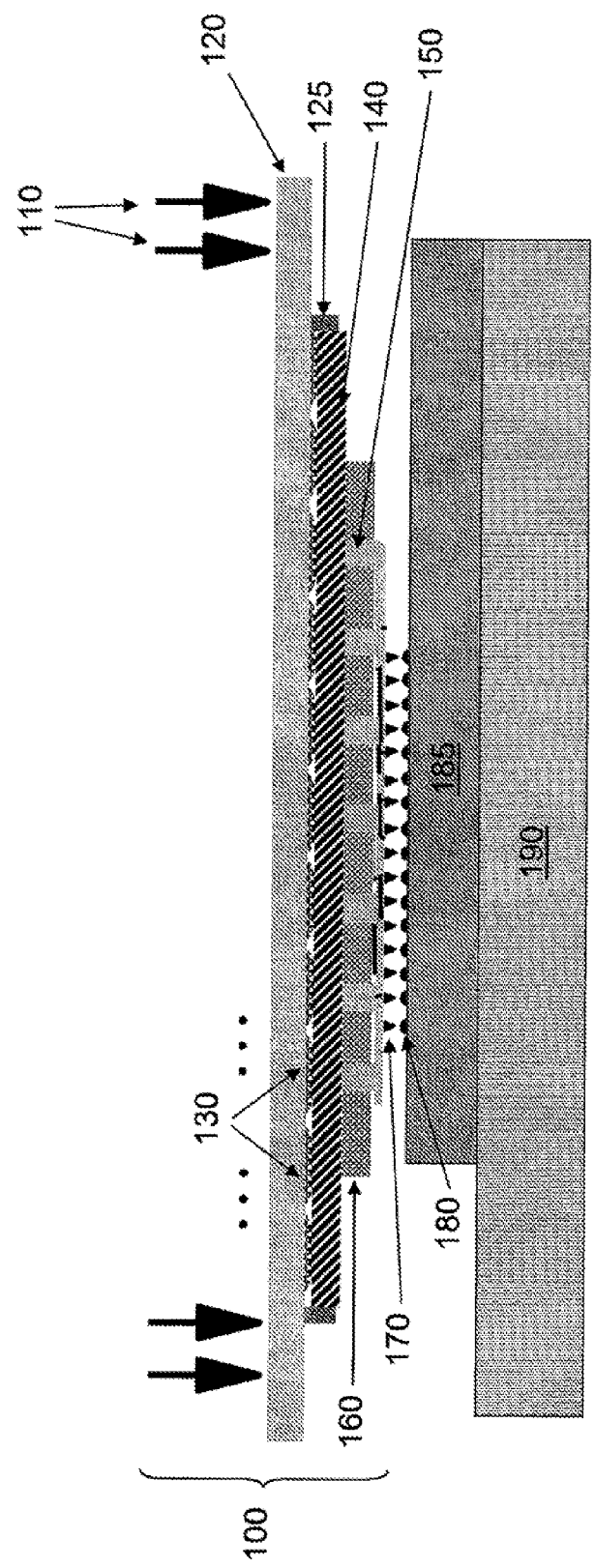
FIG. 1 is a block diagram schematically illustrating a silicon carrier space transformer assembly, according to an exemplary embodiment of the present invention, for example, for use as a die or wafer test probe.

Hereinafter, exemplary embodiments of the present invention will be described with reference to the accompanying drawings.

Various exemplary embodiments of the present invention include a space transformer to support high I/O interconnection, test and/or burn-in, with integrated function such as decoupling capacitors built into the silicon space transformer and probes for enhanced function test, enhanced throughput and lower costs.

Various exemplary embodiments of the present invention include a silicon based 110 space transformer and test probes that may be cost effectively scaled using ceramic based, thin film based or probe card based technologies. A silicon based space transformer, according to an exemplary embodiment of the present invention, includes wafer scale wiring dimensions that permit I/O interconnection and test probes that can permit about $10^4$ connections/cm$^2$ to about $10^5$ connections/cm$^2$ to over $10^6$ connections/cm$^2$.

Using a silicon based test probe or space transformer, according to an exemplary embodiment of the present invention, specific test functions can be incorporated into the test probe to permit increased functional testing, such as integrated decoupling capacitors, or protective electrostatic discharge protective devices such as diodes, which can permit testing of wafers and/or die, stacked die and/or stacked wafers at stages prior to process completion of the die, wafer, stacked die or stacked wafers or at completion of the chip, wafer, stacked chip or stacked wafer, which may permit reduced protective circuits on the die or wafer and/or permit an increased rate of functional testing and/or burn-in, which may help to reduce the cost of test and/or burn-in.

Various exemplary embodiments of the present invention include a silicon based space transformer including fine pitch probes, which can be used to test chips, wafers, stacked chips, stacked wafers and/or chips on wafers and/or for use with burn-in testing. A silicon based space transformer, according to various exemplary embodiments of the present invention, includes interconnection wiring for functional testing, opens and/or shorts testing, speed testing and/or other tests, such as for example, electrical test, electromechanical testing, optoelectronic testing, when used in combination with electronic circuits for assessment of a semiconductor component(s). A silicon based space transformer, according to various exemplary embodiments of the present invention, includes decoupling capacitance, integrated circuits to enhance the rate of test and/or burn-in, and/or diodes to avoid electrostatic discharge while testing chips, wafers, stacked chips, stacked wafers or components.

Various exemplary embodiments of the present invention include a modular test probe that includes enhanced integrated function such as active circuits, and may permit lower cost testing, higher throughputs and/or testing function not possible with more remote active circuits and/or components. A silicon based space transformer, according to various exemplary embodiments of the present invention, contains active devices for use in various test functions, for example, providing driver or repeater or buffer of signal for propagation.

A silicon based space transformer, according to various exemplary embodiments of the present invention, may be optimized to minimize total power or distribute power or to manage hot spots during test and/or burn-in, for example, by reducing power in or about certain areas on one or more chips, one or more Si carriers in a module.

Various exemplary embodiments of the present invention include a modular test probe design including one or more silicon structures, which can provide space transformer scaling to permit interconnection for fine pitch I/O interconnections on the die or wafer side and utilizing through silicon vias and/or wiring fan-out to permit electrical contact to a semiconductor chip, wafer, chip stack or wafer stack.

Various exemplary embodiments of the present invention include a modular test probe that includes integrated function such as passive circuits or components, and may permit lower cost testing, higher throughputs and/or testing function not possible with more remote passive circuits or components. A silicon based space transformer, according to various exemplary embodiments of the present invention, contains passive integrated components for use in various test functions, such as to provide decoupling capacitance for enhanced frequency test and/or for power distribution and may be optimized to minimize total power or distribute power at one or more power levels and/or to manage hot spots during test and/or burn-in, for example, by supporting power in or about certain areas on one or more chips requiring a higher level of power and can be supported by said one or more Si carriers and/or supporting packages in the space transformer and associated assembly.

Various exemplary embodiments of the present invention include a modular test probe that includes integration of embedded or fully integrated components including but not limited to resistors, capacitors, inductors, or registers as well as assembly of discrete components including but not limited to resistors, capacitors, inductors, or registers to facilitate and/or enhance testing functions. Various exemplary embodiments of the present invention include a modular test probe that includes assembly of known good devices and/or test enhancing chips including but not limited to a processor, memory, controller, or switch chips that issue testing command and instructions to device under test, store test results, process test results and take corrective actions so that the modular test probe can be an intelligent test probe that requires minimal or no input from an offline tester.

FIG. 1 is a block diagram schematically illustrating a silicon carrier space transformer assembly, according to an exemplary embodiment of the present invention, for example, for use as a die or wafer test probe. Referring to FIG. 1, the silicon carrier structure 100 includes a printed wiring board 120 having pogo pin contacts 110, base substrate 140, interconnections 130, seal 125, Si platform 160 having Si vias 150, and fine pitch probes tips 170. In FIG. 1, a wafer or die under test 185 is shown on a platform 190.

The base substrate 140 may comprise a printed circuit board, a card, a ceramic, a semiconductor or an organic substrate. The pogo pin contacts 110 may be used for electrical interconnection to and from a tester (not shown).

The seal 125 may comprise a vacuum seal, polymer or metallic seal. The control of the seal may permit vacuum place for accurate alignment purposes and support an elastomeric interconnection so as to provide vertical support for movement to match expansion or contraction with temperature for the device under test (DUT).

Interconnections 130 from the printed wiring board (PWB) 120 to the base substrate 140 and/or from the base substrate 140 to the Si platform 160 may comprise a ball grid array, land grid array, pins or column grid array, conductive polymers, conductive springs, area array solder connections like C-4 (controlled collapse chip connections), and with or without underfill epoxy adhesives or other electrical interconnect for permanent or temporary bonding.

The silicon carrier structure 100 may utilize polymer or filled polymer adhesives, in addition to electrical interconnections such as solder, to improve structure and/or thermal characteristics between semiconductors, Si carriers, supporting packages and/or boards. Chip to Si carrier and Si carrier to package (ceramic, or organic or board or Si carrier or other carrier) can have one or more connections, which may utilize conductors such as metals, including but not limited to, copper (Cu), nickel, solder, Ti, Ta, TiW, Cr, Cr/Cu, Ni, Au, or composite metals, metal-polymers or other conductors.

Chip to Si carrier and Si carrier to package structures may have one or more micro size connections, which may be less than about 200 microns in size, where said structures may be reduced in size such that small capacitance is obtained. For example, connections may be from less than 1 micron height and/or diameter to over 200 microns (example of chip to Si carrier micro joints may be about 5, 10, 25, 50 or 100 microns in diameter, and height may be similar, which may support high speed and high bandwidth communication).

The base substrate 140 may be used as an electrical and mechanical platform substrate. The base substrate 140 may comprise ceramic, organic, semiconductor or PWB card with X-Y and Z which includes wiring from the printed wiring board 120 to the Si platform 160.

The Si platform 160 may include X-Y and Z through-silicon vias (TSV). The Si platform 160 may be used as an electrical and mechanical platform for test probes, space transformation, test to wafers and/or die. The Si platform 160 may include integrated devices such as resistors, capacitors, inductors, electrostatic discharge protective circuits, active circuits, discrete devices and/or chips and support the probe tips for contact to wafer electrical pads, bumps or studs.

A silicon carrier space transformer assembly, according to various exemplary embodiments of the present invention, may comprise one or more levels of semiconductor wiring for signal and/or power interconnections in silicon or other semiconductor material and may use through Si interconnections and/or wiring on one or more levels. A silicon carrier space transformer assembly may include epitaxial Si, bulk Si, SiOx, SiNx, PI or other semiconductor and dielectric levels, along with metal conductors, such as for example, Cu, Ni, W, Al, alloys thereof, and/or other electrical conductors.

A silicon cattier space transformer assembly may utilize power and ground shielding for wiring and/or vias.

A silicon carrier space transformer assembly, according to various exemplary embodiments of the present invention, comprises active devices. Examples of active devices include, but are not limited to, electrostatic discharge (ESD) protective circuitry to protect chip or wafer testing, integrated optical drivers or receivers for testing devices for one or more optical signals, drivers, registers, electrical signals or a combination thereof. The active devices may comprise integrated optical drivers or receivers for electrical testing and burn-in.

The fine pitch probes tips 170 may be fabricated directly on the silicon substrate. The fine pitch probes tips 170 may be transfer joined to the surface of the silicon substrate. The fine pitch probes tips 170 may be fabricated from Cu, Ni, Pd, Pt, Ti, W, or other metallurgies or alloys. Probes can scale with fine pitch probes such as at 50 micron pitch, 20 micron pitch, <4 micron pitch. The fine pitch test probe tips may have a large pitch such as between about 100 microns and 200 microns. In an exemplary embodiment of the present invention, the fine pitch test probe tips have a pitch in the range of about 5 microns to about 50 microns pitch.

The fine pitch probes tips 170 may be removeably connected to the one or more silicon structures, for example, by adhesive. The fine pitch test probe tips 170 may be permanently connected to the one or more silicon structures, for example, by solder. The fine pitch test probe tips 170 may comprise various materials, such as for example, Ni, Au, Pd, Pt, Rh, Cu, Ru and/or alloys thereof. The fine pitch test probe tips 170 may be formed by etching. The fine pitch test probe tips 170 may be formed by plating or additive deposition of metals. The fine pitch test probe tips 170 may be formed by a combination of etching and additive metal deposition processes. The fine pitch test probe tips may be formed by etching and can receive surface metallurgy depositions such as Cu—Ni—Au or Cu—Ni—Pd—Co or other surface metallurgy, for example, to minimize probe wear and/or to minimize contact resistance during testing.

As shown in FIG. 1, connections 180 on the die or wafer may comprise fine pitch conductive microbumps (e.g., solder) with underlying pads, pads only, studs or other fine pitch pads on a die. Microbumps, pads or studs on die or wafer can scale to fine pitch and be matched to corresponding probe tips 170 or having one or more pitch interconnections on the probes and corresponding die bumps or pads on die or wafers. For example, the microbumps with fine pitch probes can be at 50 micron pitch, 20 micron pitch, <4 micron pitch, or large pitch such as over 100 micron pitch.

Platform 190, which may support a wafer or die, may include an X-Y and Z precision movement table and/or may provide cooling to die or wafer. Platform 190 may be moved to move a wafer under the test probes. In an exemplary embodiment of the present invention, a silicon carrier space transformer assembly can be moved above a die or wafer to step and test each die or multiple die on wafer.

A silicon carrier space transformer assembly, according to various exemplary embodiments of the present invention, includes enhanced integrated function such as active and passive circuits (e.g., decoupling capacitors) and may permit lower cost testing, higher throughputs and/or testing function not possible with more remote active and passive circuits or components. ESD protective circuitry to protect chip and/or wafer testing may be included. Decoupling capacitors, DC inverters, resistors, and/or inductors may be included. Design function may permit probe tip compliance. Design function may incorporate desired low capacitance and inductance for testing based on size, proximity of test probe tips and associated circuitry to test pads and/or bumps.

A silicon carrier space transformer assembly, according to various exemplary embodiments of the present invention, permits test and/or burn-in one or more semiconductor technologies as independent chips or as effective virtual chips sets. For example, mixed technologies and/or functional testing may be used (e.g., CMOS, SiGe, microprocessor, memory, accelerator die, clocking distribution, etc.). A silicon carrier space transformer assembly, according to various exemplary embodiments of the present invention, permits test, speed sort die, perform shorts and opens testing, and may be co-designed between chip(s), Si carrier(s) and packaging to optimize for low cost and high yield, for wiring, performance and/or for power.

A silicon carrier space transformer assembly, according to various exemplary embodiments of the present invention, may be utilized for test applications such as a virtual chip (e.g. one or more chips to be tested for functionality together), high bandwidth microprocessor(s), communications, networking, games, automotive, military, super computer, server, pervasive solution or other application.

In an exemplary embodiment of the present invention, a method of fabricating a silicon carrier structure includes providing a Si wafer, fabricating through via connections where at least one via is fabricated through the silicon with a conductor such as a composite via which may contain a plated via sidewall, composite of metal, ceramic and/or polymer, fabricating transistors and/or active circuits on one or both sides of one or more Si carrier(s), which may be placed between one or more semiconductor chips and a board or package, fabricating signal wiring, power, ground and insulating layers on one or more levels, and utilizing interconnection means such as deposition of solder on chips, Si carrier and/or board to join one or more Si carriers to packages or boards and to join one or more Si chips, or other components or semiconductor devices to form a module. Active circuits, wiring and/or dielectric may be deposited on either side of each Si carrier to maintain co-planarity or reduce residual bending or bow of component in free standing state to enhance yield.

FIG. 2 is a block diagram schematically illustrating a silicon carrier space transformer assembly, according to an exemplary embodiment of the present invention, for example, for use as a socket for die burn-in. The silicon carrier space transformer assembly of FIG. 2 is similar to the structure of FIG. 1, except for the base substrate 240, interconnections 230 and the precision socket 290, and further description of the elements in common will be omitted in the interests of clarity.

Referring to FIG. 2, the interconnection to the card or test board can be completed with surface mount technology, such as for example, ball grid array (BGA), column grid array (CGA), land grid array (LGA) or pins. The base substrate 240 includes interconnections 230, such as BGA solder balls for connection to the board, CGA solder columns, or copper-column grid array (CCGA) connections to the board or LGA connections with surface pads being electrically connected to the board, for example, using a spring, fuzz-button or other socket type or spring connection to the board. For socket testing, one or more base substrates 240 may be connected to the printed wiring board 220 for burn-in of one or more die 285. The die 285 can be attached to the silicon interposer 260 by means of a precision socket 290 to hold the die in position and electrical connection is made between contact probe pads 270 on the silicon interposer 260 and the corresponding solder pads on the die 280. Electrical connections are made from the PWB 220 through interconnections 230 to the substrate 240 and through the interconnections and TSV 250 between the substrate 240 and the silicon interposer 260 to the surface pads or probes 270 and then through the contact solder bumps or pads 280 to the die under burn-in 285. Heat can be removed from the "back side" (opposite side from die connections) of the die by means of a thermal interface material which can contact the socket/cooling plate 290. The PWB with mounted substrates and die can then undergo burn-in (power on of the die) for a specified time, temperature to meet readiness of the die for product application.

FIG. 3 is a flowchart illustrating a method of fabricating a silicon carrier space transformer assembly, according to an exemplary embodiment of the present invention.

Referring to FIG. 3, a wafer 310 undergoes deep reactive ion etch (DRIE) 320 to form etched vertical holes in the silicon. In block 330, via insulation and metallization can be achieved using thermal oxidation to create an SiO2 layer or using SiOx or SiNx depositions such as plasma-enhanced chemical vapor deposition (PECVD) or other deposition techniques. A liner such as Ta/TaN and a metal conductor such as W can be deposited by CVD to form a vertical electrical connection or through silicon via (TSV).

In block 340, circuits, decoupling capacitors, back-end-of-line (BEOL) wiring and/or probe tips are fabricated. For example, BEOL wiring can be deposited to form X-Y wiring interconnections for redistribution or space transformation connections, power and ground. For integrated decoupling capacitors and/or active circuit integrated fabrication into a silicon carrier space transformer, following via insulation in block 330, a temporary poly silicon is deposited, followed by circuits and/or decoupling capacitor (active and/or passive devices) processing using standard front-end-of-line (FEOL) processing, after which the poly-silicon is removed from the TSV and a liner/conductor of Ta/TaN and W can be deposited followed by BEOL wiring. The wafer can be finished with surface pads and probe tips, for example, using plating for pads and etch back for probe tip fabrication. For the probe tips, surface metallization such as Cu—Ni—Au or Cu—Ni—P—Co or other metallurgy may be used to improve the abrasion resistance of the pads and to minimize electrical contact resistance for the pads.

In block 350, a glass handle wafer is attached, for example, using a polymer adhesive, followed by wafer thinning where mechanical grinding, polish and/or RIE are used to thin the wafer. In block 360, the back side receives oxide deposition over exposed silicon, for example, using PECVD. In block 370, Surface pads and microbumps or copper interconnections are deposited using lithography and depositions or plating. In block 380, the silicon interposers/probes are diced and tested to known specifications and are ready for further module assembly.

FIG. 4 is a flowchart illustrating a method of assembling a silicon space transformer assembly, according to an exemplary embodiment of the present invention.

Referring to FIG. 4, a silicon space transformer (e.g., 160 or 260) is attached to a substrate, such as base substrate 140 or 240, using solder reflow or copper to copper bonding, in block 410. Next, in block 420, the mechanical handler is removed. For example, the mechanical handler may be removed using a laser scan to release the adhesive or chemical release to dissolve the adhesive. The surface is then cleaned using oxygen, chemical clean or other cleaning method to remove any residue.

In block 430, the base substrate 140 or 240 is attached to the PWB 120 or 220. For example, the substrate may be attached to the PWB using surface mount attach BGA or CGA or may be attached with a socket/LGA connection 430. The assembly undergoes test evaluation of the silicon space transformation 440 followed by mounting into the tester 450 to be ready for die or wafer testing.

FIG. 5 is a flowchart illustrating a method of wafer level test, according to an exemplary embodiment of the present invention.

Referring to FIG. 5, the Si space transformer assembly with test probes in moved within the test machine into X-Y position to align with the corresponding die on the wafer to be tested and then Z movement in the tool presses the test probe/Si space transformer against the die to be tested, in block 510. Data during test is recorded as needed, in block 520. This process repeats across the wafer for each die to be tested, in block 530.

FIG. 6 is a flowchart illustrating a method for use of a socket for die test and/or for burn-in, according to an exemplary embodiment of the present invention.

Referring to FIG. 6, the die are loaded in the precision socket, in block 610. Electrical test or burn-in is performed for the one or more die per board, in block 620. Data is recorded, and hardware is removed and sorted per data read out and then the sequence is repeated with reuse of the hardware for new die, in block 630.

Figure 7:
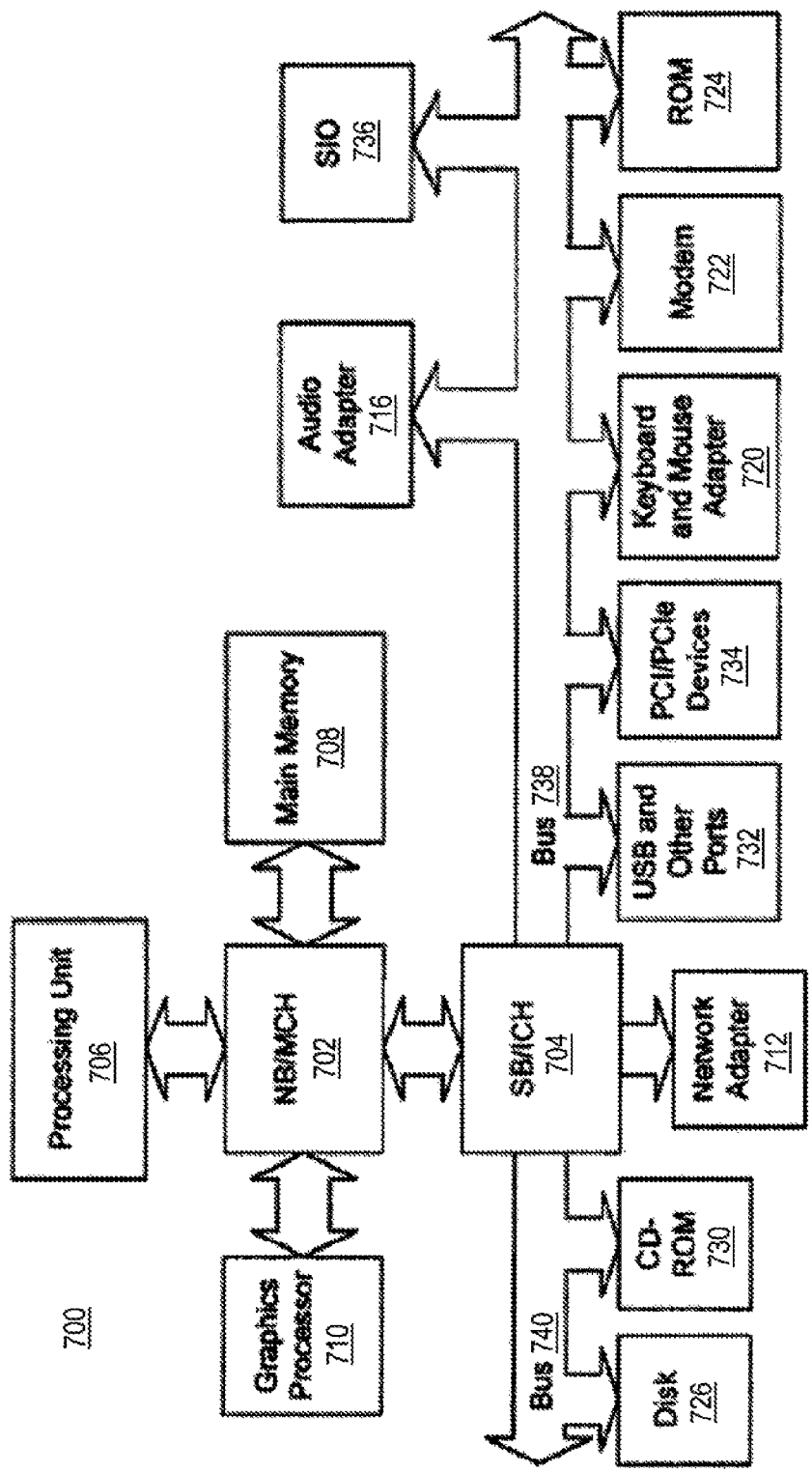
FIG. 7 is a block diagram of a data processing system, which may be used to implement an exemplary embodiment of the present invention.

FIG. 7 is a block diagram of a data processing system, which may be used to implement an exemplary embodiment of the present invention. Data processing system 700 is an example of a computer, in which computer usable code or instructions implementing processes of embodiments of the present invention may be located.

In the depicted example, data processing system 700 employs a hub architecture including a north bridge and memory controller hub (NB/MCH) 702 and a south bridge and input/output (I/O) controller hub (SB/ICH) 704. Processing unit 706 that includes one or more processors, main memory 708, and graphics processor 710 are coupled to the north bridge and memory controller hub 702. Graphics processor 710 may be coupled to the NB/MCH 702 through an accelerated graphics port (AGP). Data processing system 700 may be, for example, a symmetric multiprocessor (SMP) system including a plurality of processors in processing unit 706. Data processing system 700 may be a single processor system.

In the depicted example, local area network (LAN) adapter 712 is coupled to south bridge and I/O controller hub 704. Audio adapter 716, keyboard and mouse adapter 720, modem 722, read only memory (ROM) 724, universal serial bus (USB) ports and other communications ports 732, and PCI/PCIe (PCI Express) devices 734 are coupled to south bridge and I/O controller hub 704 through bus 738, and hard disk drive (HDD) 726 and CD-ROM drive 730 are coupled to south bridge and I/O controller hub 704 through bus 740.

Examples of PCI/PCIe devices include Ethernet adapters, add-in cards, and PC cards for notebook computers. In general, PCI uses a card bus controller while PCIe does not. ROM 724 may be, for example, a flash binary input/output system (BIOS). Hard disk drive 726 and CD-ROM drive 730 may use, for example, an integrated drive electronics (IDE) or serial advanced technology attachment (SATA) interface. A super I/O (SIO) device 736 may be coupled to south bridge and I/O controller hub 704.

An operating system, which may run on processing unit 706, coordinates and provides control of various components within data processing system 700. For example, the operating system may be a commercially available operating system such as Microsoft® Windows® XP (Microsoft and Windows are trademarks or registered trademarks of Microsoft Corporation in the United States, other countries, or both). An object-oriented programming system, such as the Java™ programming system, may run in conjunction with the operating system and provides calls to the operating system from Java programs or applications executing on data processing system 700 (Java and all Java-based marks are trademarks or registered trademarks of Sun Microsystems, Inc. in the United States, other countries, or both).

Instructions for the operating system, object-oriented programming system, applications and/or programs of instructions are located on storage devices, such as for example, hard disk drive 726, and may be loaded into main memory 708 for execution by processing unit 706. Processes of exemplary embodiments of the present invention may be performed by processing unit 706 using computer usable program code, which may be located in a memory, such as for example, main memory 708, read only memory 724 or in one or more peripheral devices.

It will be appreciated that the hardware depicted in FIG. 7 may vary depending on the implementation. Other internal hardware or peripheral devices, such as flash memory, equivalent non-volatile memory, or optical disk drives and the like, may be used in addition to or in place of the depicted hardware. Processes of embodiments of the present invention may be applied to a multiprocessor data processing system.

Data processing system 700 may take various forms. For example, data processing system 700 may be a tablet computer, laptop computer, or telephone device. Data processing system 700 may be, for example, a personal digital assistant (PDA), which may be configured with flash memory to provide non-volatile memory for storing operating system files and/or user-generated data. A bus system within data processing system 700 may include one or more buses, such as a system bus, an I/O bus and PCI bus. It is to be understood that the bus system may be implemented using any type of communications fabric or architecture that provides for a transfer of data between different components or devices coupled to the fabric or architecture. A communications unit may include one or more devices used to transmit and receive data, such as modem 722 or network adapter 712. A memory may be, for example, main memory 708, ROM 724 or a cache such as found in north bridge and memory controller hub 702. A processing unit 706 may include one or more processors or CPUs.

Test procedures for testing a semiconductor die or wafer according to exemplary embodiments of the present invention may be performed in a data processing system such as data processing system 700 shown in FIG. 7.

It is to be understood that a program storage device can be any medium that can contain, store, communicate, propagate or transport a program of instructions for use by or in connection with an instruction execution system, apparatus or device. The medium can be, for example, an electronic, magnetic, optical, electromagnetic, infrared, or semiconductor system (or apparatus or device) or a propagation medium. Examples of a program storage device include a semiconductor or solid state memory, magnetic tape, removable computer diskettes, RAM (random access memory), ROM (read-only memory), rigid magnetic disks, and optical disks such as a CD-ROM, CD-R/W and DVD.

A data processing system suitable for storing and/or executing a program of instructions may include one or more processors coupled directly or indirectly to memory elements through a system bus. The memory elements can include local memory employed during actual execution of the program code, bulk storage, and cache memories that provide temporary storage of at least some program code to reduce the number of times code must be retrieved from bulk storage during execution.

Data processing system 700 may include input/output (I/O) devices, such as for example, keyboards, displays and pointing devices, which can be coupled to the system either directly or through intervening I/O controllers. Network adapters may also be coupled to the system to enable the data processing system to become coupled to other data processing systems or remote printers or storage devices through intervening private or public networks. Network adapters include, but are not limited to, modems, cable modem and Ethernet cards.

Various exemplary embodiments of the present invention permit electrical, optical or a combination of electrical and optical test function, or other multifunction characterization of components or products, based on the function that is built into the tester and silicon space transformer platform.

According to an exemplary embodiment of the present invention, a system for electrical test includes test probes, silicon transformer substrate with wiring fan-out and/or TSV such that the integration of hardware and software can permit electrical test and/or burn-in of hardware such as die, wafers, die stacks, packages and/or other microelectronic hardware. According to various exemplary embodiment of the present invention, a system for electrical test includes decoupling capacitors or active circuits integrated in the silicon substrate or attached to the assembly, silicon support substrate such as thick Si, ceramic and/or organic package, PWB and associated interconnections.

According to an exemplary embodiment of the present invention, a system for optical hardware includes integrated hardware to test fine pitch area array or close proximity optical waveguides, optical fibers, vertical-cavity surface-emitting (VCSEL) or photodetectors. According to various exemplary embodiments of the present invention, a system for optical hardware includes a silicon platform with integrated hardware in or on the assembly such as area array photo detectors, area array VCSELs, and associated optical and/or electrical circuits so as to permit electrical and/or optical test and characterization of the optical hardware.

According to an exemplary embodiment of the present invention, a system for combined electrical and optical testing, such as opto-electronic transceivers, die or wafers with electrical and optical circuits or for alternative dual purpose testing such as electrical and mechanical test such as with micro-electronic-mechanical devices (MEMS) used as actuators, switches or for micro or nano sensors or other "miniaturized" components or products, again the silicon based transformation platform with integrated test probes and other function integrated in or on the platform, provides a means to fabricate and integrate the test and/or burn-in function to characterize these multipurpose components or product. Test and characterization may include function, performance, power, and speed as few examples of the integrated test and burn-in platform based on this silicon space transformer platform and associated tester.

A test system, according to an exemplary embodiment of the present invention, includes a silicon space transformer probe head structure, a memory system for storing a program code for a number of testing procedures, and a processor in communication with the memory system, wherein the processor executes the program code to implement testing of the semiconductor die or wafer using the silicon space transformer probe head structure. The silicon space transformer probe head structure may comprise a silicon carrier space transformer assembly, which may include one or more silicon structures which provide space transformer scaling to permit interconnection for fine pitch input/output interconnections on a semiconductor die or wafer, and fine pitch test probe tips attached to the one or more silicon structures. The silicon carrier space transformer assembly may be configured to test die on wafers with fine pitch interconnections (e.g., under 1 micron pitch to about 100 micron pitch, or scale to larger or smaller pitch size). The silicon carrier space transformer assembly may be configured to burn-in one or more die on test boards with fine pitch interconnections.

Although exemplary embodiments of the present invention have been described in detail with reference to the accompanying drawings for the purpose of illustration and description, it is to be understood that the inventive processes and apparatus are not to be construed as limited thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. A method of fabricating a silicon carrier space transformer, comprising:
   etching a wafer to form etched vertical holes in the wafer;
   forming via insulation and metallization using thermal oxidation;
   forming back-end-of-line wiring to form X-Y wiring interconnections for space transformation connections, power and ground;
   forming a plurality of test probe tips on the wafer; and
   forming a movable platform to support a die having a plurality of surface pads, a plurality of microbumps or a plurality of copper interconnections disposed thereon and further configured to bring the die into contact with the plurality of test probe tips.

2. The method of claim 1, further comprising:
   attaching a glass handle to the wafer using a polymer adhesive; and
   thinning the wafer using mechanical grinding or polishing.

3. The method of claim 2, further comprising dicing the wafer to produce a plurality of silicon carrier space transformers.

4. The method of claim 1, further comprising:
   after forming via insulation, depositing a poly silicon layer; and
   forming a number of decoupling capacitors using front-end-of-line processing, after which the poly-silicon layer is removed.

5. A method of fabricating a silicon carrier space transformer, comprising:
   etching a wafer to form etched vertical holes in the wafer;
   forming via insulation and metallization using thermal oxidation;
   forming back-end-of-line wiring to form X-Y wiring interconnections for space transformation connections, power and ground;
   forming at least one of surface pads, microbumps or copper interconnections;
   forming a number of probe tips on the wafer;
   attaching a glass handle to the wafer using a polymer adhesive; and
   thinning the wafer using mechanical grinding or polishing.

6. The method of claim 5, further comprising dicing the wafer to produce a plurality of silicon carrier space transformers.

7. A method of fabricating a silicon carrier space transformer, comprising:
  etching a wafer to form etched vertical holes in the wafer;
  forming via insulation and metallization using thermal oxidation;
  forming back-end-of-line wiring to form X-Y wiring interconnections for space transformation connections, power and ground;
  forming at least one of surface pads, microbumps or copper interconnections;
  forming a number of probe tips on the wafer;
  after forming via insulation, depositing a poly silicon layer; and
  forming a number of decoupling capacitors using front-end-of-line processing, after which the poly-silicon layer is removed.

* * * * *